United States Patent [19]

Nakabayashi et al.

[11] 4,165,265

[45] Aug. 21, 1979

[54] MULTI-STAGE IRRADIATION METHOD OF CURING A PHOTOCURABLE COATING COMPOSITION

[75] Inventors: Seizi Nakabayashi, Itami; Taizo Matsuura, Hirakata; Tamio Iimure, Kyoto, all of Japan

[73] Assignee: Nippon Paint Co., Ltd., Osaka, Japan

[21] Appl. No.: 894,505

[22] Filed: Apr. 7, 1978

Related U.S. Application Data

[63] Continuation of Ser. No. 667,031, Mar. 15, 1976, abandoned, which is a continuation-in-part of Ser. No. 506,193, Sep. 13, 1974, abandoned.

[30] Foreign Application Priority Data

Sep. 17, 1973 [JP] Japan ................... 48-104726

[51] Int. Cl.$^2$ .................. C08G 18/00; C08G 63/00
[52] U.S. Cl. .................. 204/159.14; 204/159.15; 204/159.16; 204/159.19; 260/22 CB; 260/22 TN; 260/31.2 N; 260/40 R; 260/40 TN; 427/54; 428/425; 428/458; 428/461
[58] Field of Search .................. 204/159.15, 159.14, 204/159.16, 159.19

[56] References Cited

U.S. PATENT DOCUMENTS

| | | | |
|---|---|---|---|
| 3,790,801 | 2/1974 | Coleman | 427/54 X |
| 3,840,448 | 10/1974 | Osborn et al. | 204/159.14 |
| 3,918,393 | 11/1975 | Hahn | 427/38 |
| 3,943,046 | 3/1976 | De Sorga et al. | 204/159.23 |

*Primary Examiner*—Richard B. Turer
*Attorney, Agent, or Firm*—Wenderoth, Lind & Ponack

[57] ABSTRACT

A method of curing a photo-curable coating composition comprises multi-stage irradiation steps with actinic radiations in the presence of air: the initial step involving irradiation with actinic radiation having wavelengths in a range from about 185 to 500 millimicrons with dominant wavelength or wavelengths between about 380 and 420 millimicrons and the subsequent step involving irradiation with another actinic radiation of wavelengths within the same range as those of the radiation used for the initial step but having dominant wavelength or wavelengths within a range shorter than those of the radiation used therefor and the initial irradiation being effected so as to cure the lower part of the coating layer with the surface portion thereof left uncured and the subsequent irradiation leading to the full cure of the surface portion thereof. The coating film or layer thus treated possesses a high covering or hiding power, good appearance and desired shade with a smooth and glossy surface, having neither crinkles nor wrinkles thereon.

11 Claims, 1 Drawing Figure

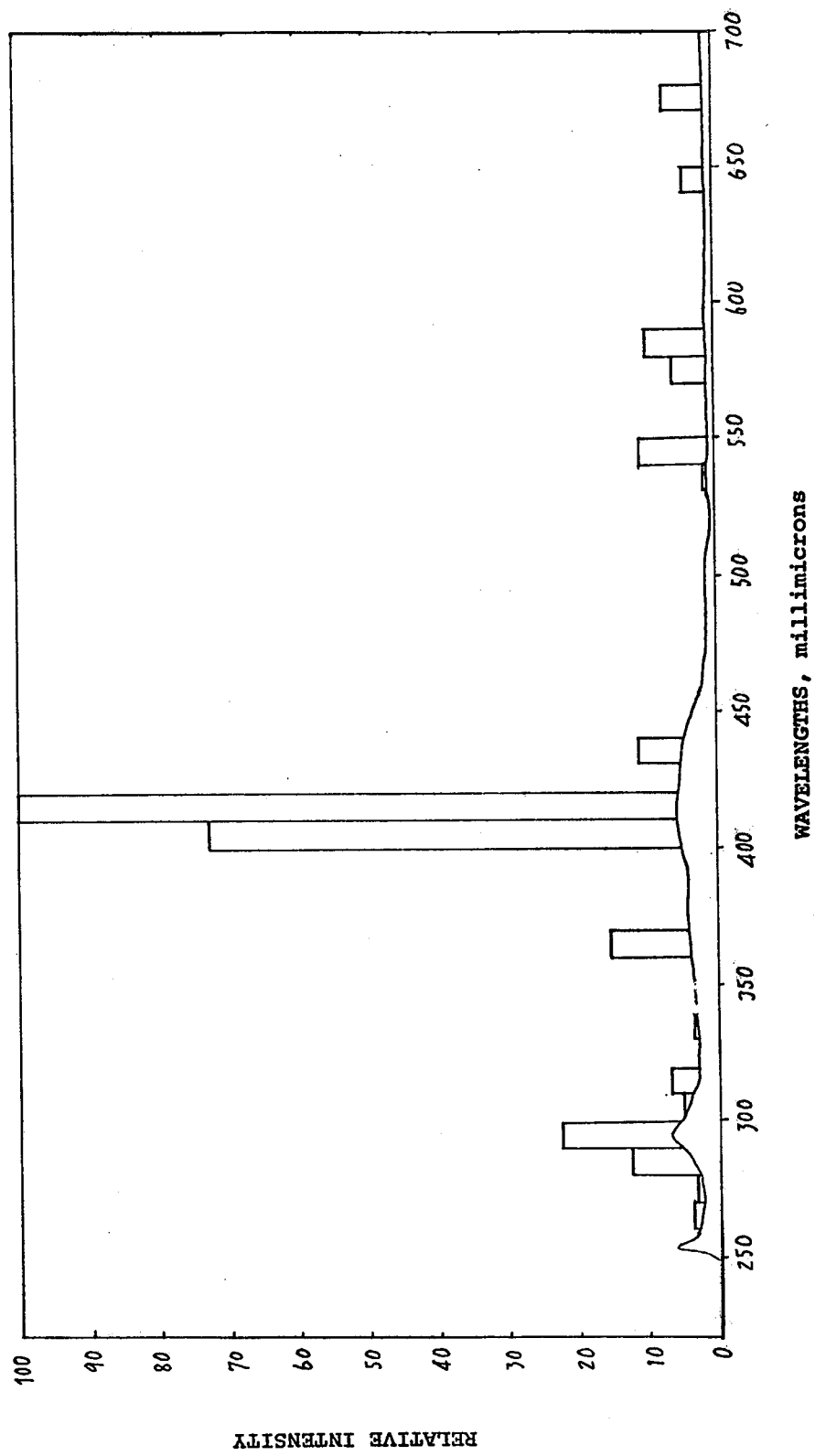

MULTI-STAGE IRRADIATION METHOD OF CURING A PHOTOCURABLE COATING COMPOSITION

This application is a continuation of application Ser. No. 667,031, filed Mar. 15, 1976, which in turn is a continuation-in-part application of application Ser. No. 506,193, filed Sept. 13, 1974, both applications now being abandoned.

The present invention relates to a multi-stage irradiation method of curing a photocurable coating composition. More particularly, the present invention relates to a multi-stage irradiation method of curing a photocurable coating composition in the presence of air in which the lower or inner portion of the coating is initially cured by using a metal halide lamp having dominant wavelength or wavelengths at a particular radiation line or lines and the surface portion thereof is then cured by using a mercury lamp.

The use of ultraviolet radiation, both shortwave and near ultraviolet, in the field of radiation curing of coatings has presented a significant problem associated with the difficulty in obtaining adequate surface cure of the composition. In attempts to overcome the deficiency, source power input per unit length has been increased with resultant increased ultraviolet-ray intensity and broadened spectral distribution throughout the shortwave ultraviolet and near ultraviolet regions, so that a sufficiently high flux can be delivered to the surface of the exposed composition when curing in air, whereby air cure can be achieved.

It was further found desirable to utilize short wave ultraviolet radiation that is preferentially absorbed and efficiently used at the surface of the coating. U.S. Pat. No. 3,840,448 to Osborn et al. discloses the use of such short wave ultraviolet radiation represented by the 2,537 Angstrom (i.e. 253.7 millimicrons) and 1,850 Angstrom (i.e. 185.0 millimicrons) resonance lines of mercury. Furthermore, as is shown in FIG. 1 of the said patent and set forth in column 3 of the description thereof, it is noted that the lamps should have a main radiation line at 2,537 Angstrom units and a minor radiation line at 1,850 Angstrom units with essentially all of the ultraviolet light radiation emitted at these two wavelengths. It is further disclosed in column 2 therein that an efficient source of this shortwave ultraviolet radiation is the low-pressure, low intensity, short wave ultraviolet tube having an electrical input power up to about 5 watts per inch of length. However, it is also disclosed therein that when these lamps are employed in the presence of air, even though the energy is preferentially absorbed and used at the surface of the coating, the flux level achieved is insufficient to cure the surface due to oxygen inhibition; accordingly, these low intensity lamps were efficiently and advantageously used in the presence of an inert atmosphere.

We have now discovered that the improved effects of curing or cross-linking a photocurable coating composition can be achieved even when multi-stage irradiation is carried out in the presence of air with the use of a metal halide lamp having dominant wavelength or wavelengths at near ultraviolet region, particularly at the border region of ultraviolet rays and visible light and having broadened spectral distribution as is shown in the accompanying FIGURE. For this purpose, the empolyment of the lamp capable of radiation at wavelengths of about 185 to 500 millimicrons and having a dominant wavelength of wavelengths at a particular radiation line or lines within the said wavelength range is essential as a light source for the initial step of irradiation. It has been found that this multi-stage curing method can provide the coating of the composition with a high hiding or covering power, good appearance and desired shade as well as a smooth and glossy surface with no undesirable physical defects such as crinkles or wrinkles formed on the coating surface. The multi-stage method according to the present invention, in which the curing is accomplished in the presence of air can offer the benefits from the standpoint of operations and economics, as compared with the prior art method that is carried out in an inert gas atmosphere.

It is therefore an object of the present invention to provide a multi-stage irradiation method of curing a photocurable coating composition.

It is another object of the present invention to provide a method in which irradiation is carried out in the presence of air in a plurality of stages, particularly in two stages.

Other objects, features and advantages of the present invention will become apparent in the following description of the specification and from the appended claims and the accompanying drawing in which:

FIGURE is the spectrum of the radiation that emanates from a typical metal halide lamp according to the present invention.

The multi-stage curing method according to the present invention involves an initial exposure of the coating layer of a photocurable coating composition to actinic radiation of wavelengths in the range of about 185 to 500 millimicrons and having a dominant wavelength or wavelengths within the range between about 380 and 420 millimicrons and the subsequent exposure of the partially cured coating layer with its surface portion left still uncured to another actinic radiation having wavelengths from about 185 to 500 millimicrons and having dominant wavelength or wavelengths shorter than those of the radiation for the initial exposure yet within said range of wavelengths, thereby curing fully the surface of the coating.

The actinic radiation referred to herein is any radiation that is capable of emitting energy from a source to such an extent that the coating of the photocurable composition is cured. Such radiation includes, for example, actinic radiation such as ultraviolet rays. Visible light may also be used for this purpose if an appropriate photosensitizer is employed.

Sources of the actinic radiation to used for the initial step of the method according to the present invention are metal halide lamps of a type capable of emitting radiation having wavelengths from about 185 to 500 millimicrons with their dominant wavelength or wavelengths at about 380 to 420 millimicrons. Said metal halide lamps are those which contain one or more metals and/or metallic compounds as well as argon and mercury. Such metals and metallic compounds are any metal and metallic compound which can emit radiation of dominant wavelength or wavelengths longer than those of conventional medium pressure or high pressure mercury lamps and within the range of about 380 to 420 millimicrons. The relative intensity or energy of the dominant wavelength or wavelengths of the metal or the metallic compound should be greater than that of about 365 millimicrons of the mercury. Examples of such metals per se and the metal of the metallic compounds are gallium, lead, aluminum, calcium, cerium, indium, potassium, lanthanum, magnesium, manganese, molybdenum, niobium, scandium, strontium, thorium, and the like. The metal may be used as such or in the form of a metallic compound. The preferred form of the metallic compound is a metal iodide, particularly gallium iodide, but it is not limited thereto. For example, a metal bromide may be employed. Selection of either the metal per se or the metallic compound depends upon the vaporizability and/or stability of the material to be used. The metal and/or the metallic compound may be employed alone or in combination with one or more additional metals and/or metallic compounds. In this case, it is desirable to combine these materials so as not to interfere with each other and with their emission lights.

The irradiation time for the initial stage may vary depending upon the intensity of radiation and the type of a photocurable coating composition used. It is preferable to choose a period of irradiation time in such a manner that the lower part of a coating layer of the composition is initially cured or cross-linked satisfactorily while the surface portion thereof is still left uncured. The irradiation time may be from about 0.5 second to 20 minutes, although shorter or longer irradiation times may also be chosen according to the type of a radiation source and/or the kind of a photocurable composition used.

The subsequent stage for the curing step according to the present invention comprises irradiation with another actinic radiation whose wavelengths are present within the same range as those of the radiation used for the initial curing step and whose dominant wavelength or wavelengths should be within the said range but shorter than those of the radiation used therefor. Sources of such radiation for this curing step may be any source of radiation which is conventionally employed for photo-curing and which may include, for example, sun light, a mercury lamp, a carbon arc lamp and a xenon lamp. It is desirable to use an artificial light source such as, for example, a medium or high pressure mercury lamp which is capable of emitting a large amount of actinic radiation of wavelengths within the range of about 200 to 380 millimicrons and having the dominant wavelength or wavelengths within the same range, preferably within a range of about 360 and 380 millimicrons. The use of such radiation allows the coating to cure for a relatively short period of time and at the same time to become toughened.

The irradiation time for the subsequent curing step may vary depending upon conditions as set forth under the initial stage curing step. It is desirable to choose an irradiation time so as to provide the coating with desired properties as set forth hereinabove. The time may range from about 0.5 second to 15 minutes, but it may be varied over a wide range according to the kind of a photocurable composition used, the type of a light source, and so on.

The photocurable coating composition which can be used for the multi-stage curing method according to the present invention is any composition containing one or more photocurable resins having one or more polymerizable double bonds and a photo-sensitizer. A coloring agent may be preferably added to the composition. Said photocurable resin includes, for example, unsaturated polyester, polyurethane, acrylic, alkyd and epoxy resins.

The unsaturated polyester resin may be prepared from an unsaturated mono- or poly-carboxylic acid and/or an anhydride and/or an ester thereof by reaction with an unsaturated or saturated polyalcohol and, when desired, a saturated mono- or poly-carboxylic acid and/or an anhydride and/or an ester thereof and/or an unsaturated or saturated epoxy resin or from a saturated, mono- or poly-carboxylic acid and/or an anhydride and/or an ester thereof by reaction with an unsaturated polyalcohol and, when desired, an unsaturated or saturated epoxy compound. The unsaturated or saturated, mono- or poly-carboxylic acid and its anhydride include, for example, fumaric, itaconic, isophthalic, adipic or sebacic acid or maleic, succinic, phthalic or tetrahydrophthalic anhydride. The unsaturated or saturated polyalcohol includes, for example, ethylene glycol, propylene glycol, diethylene glycol, dipropylene glycol, trimethylol propane, 1,2-, 1,3- or 1,4-butanediol, 1,6-hexanediol, 1,10-decanediol, 1,2,6-hexanetriol, pentaerythritol, bisphenoldioxyethyl ether, bisphenoldioxypropyl ether, sorbitol, sucrose or bis(2-hydroxyethyl) maleate. The unsaturated or saturated epoxy compound includes, for example, n-butylglycidyl ether, allylglycidyl ether, a glycidyl tertiary alkanoate (for example, "Cardura E" trade mark of Shell Chemical Corp.) or di(methylglycidyl) esters of dicarboxylic acids and derivatives thereof (for example, "Epiclon", trade mark of Dainippon Ink & Chemicals, Inc.).

The unsaturated polyurethane resin may be prepared by reacting a polyol such as, for example, polyester polyol, polyether polyol, acryl polyol, epoxy polyol or polyurethane polyol with a double-bonded isocyanate derivative; by reacting the isocyanate group of a polyurethane resin with an unsaturated compound having an active hydrogen atom such as, for example, a polymerizable unsaturated carboxylic acid, alcohol or amine; by reacting the hydroxyl group of a polyurethane polyol with an unsaturated or saturated carboxylic acid or an anhydride thereof and, when desired, an unsaturated or saturated epoxy compound; and by reacting the carboxyl group of a polyurethane resin with an unsaturated or saturated epoxy compound and, when desired, an unsaturated or saturated, mono- or poly-carboxylic acid. Said polyester polyol may be prepared, for example, by reacting a polyol, as set forth above under polyalcohols, with said epoxy compound and said polycarboxylic acid or by reacting said epoxy compound with said polycarboxylic acid or by reacting said polyol with said polycarboxylic acid or by reacting the carboxyl group of said polyester polyol with a polymerizable unsaturated epoxy compound such as, for example, glycidyl methacrylate or allyl glycidyl ether, or by reacting the epoxy group of said polyester polyol with a polymerizable unsaturated carboxylic acid such as, for example, acrylic or methacrylic acid. Said acrylic polyol is a homopolymer of alkylene glycol monoacrylate or monomethacrylate or a copolymer thereof with a polymerizable monomer such as, for example, styrene, dibutyl fumarate, acrylic acid, methacrylic acid, acrylic ester, methacrylic ester, glycidyl methacrylate, ethylene, propylene, vinyl chloride, vinylidene chloride, butadiene, isoprene and vinyl acetate; a polyol prepared by the reaction of the hydroxyl group present in the side chain of an acrylic polymer with said poly-carboxylic acid or the anhydride thereof and, when desired, with said epoxy compound; a polyol prepared by the reaction of the epoxy group present in the side chain of an acrylic polymer with said mono- or poly-carboxylic acid and, when desired, with said epoxy compound; or a polyol prepared by the reaction of the carboxyl group present in the side chain of an acrylic polymer with said epoxy compound and, when desired, with said mono- or poly-carboxylic acid or its anhydride. Said polyether polyol is a polyol prepared by the addition of an alkylene oxide such as, for example, ethylene oxide, propylene oxide and tetrahydrofuran to a polyol such as, for example, ethylene glycol, diethylene glycol, propylene glycol, dipropylene glycol, glycerol, trimethylol propane, 1,3-butanediol, 1,4-butanediol, 1,6-hexanediol, 1,2,6-hexanetriol, pentaerythritol, sorbitol, sorbitan or sucrose. Said epoxy polyol is a polyol prepared from said polycarboxylic acid or a polyamine or said polyol by reaction with said epoxy compound. Said polyurethane polyol is a polyol prepared by the urethanation of said polyol compound such as polyester polyol, polyether polyol, acrylic polyol, epoxy polyol or a polyol such as, for example, ethylene glycol or dimethylene glycol with a polyisocyanate. Said polymerizable double-bonded isocyanate derivative includes, for example, a diisocyanate, a triisocyanate or other polyisocyanates such as, for example, ethylene diisocyanate, propylene diisocyanate, tetramethylene diisocyanate, xylylene diisocyanate, tolylene diisocyanate or 4,4'-methylenebis(phenylisocyanate) or an isocyanate prepared by the addition reaction between said isocyanate and a lower molecular weight polyol such as, for example, ethylene glycol, propylene glycol, hexamethylene glycol, trimethylol propane, hexanetriol, glycerin, sorbitol, sucrose or pentaerythritol or a polyisocyanate having a biuret structure or a polyisocyanate having an allophanate structure. Said unsaturated compound having an active hydrogen atom includes, for example, a polymerizable unsaturated carboxylic acid, alcohol or amine, e.g., allyl alcohol, 2-hydroxyethyl acrylate, 2-hydroxyethyl methacrylate, polyethylene glycol monoacrylate, polypropylene glycol monomethacrylate, monomethylaminoethyl methacrylate or monoethylaminoethyl acrylate. The other compounds to be used for this purpose are set forth hereinabove.

The unsaturated acrylic resin may be prepared by reacting the hydroxyl group present in the side chain of an acrylic polymer with said unsaturated or saturated, mono- or poly-carboxylic acid or its anhydride and/or said unsaturated or saturated epoxy compound or by reacting the epoxy group in the side chain of an acrylic polymer with said unsaturated or saturated, mono- or poly-carboxylic acid or its anhydride and/or said unsaturated or saturated epoxy compound, or by reacting the carboxul group present in the side chain of an acrylic polymer with said unsaturated or saturated epoxy compound and, when desired, said unsaturated or saturated, mono- or poly-carboxulic acid or its anhydride. Said acrylic polymer is any acrylic polymer having as a basic unit a residue derived, for example, from acrylic or methacrylic acid or derivatives thereof.

The unsaturated epoxy resin may be prepared from an epoxy polymer prepared by reacting, for example, a phenol derivative with epichlorohydrin by the reaction of the hydroxyl group and/or epoxy group of said epoxy polymer with said unsaturated or saturated carboxylic acid or its anhydride and, when desired, said unsaturated or saturated, mono- or poly-epoxy compound.

The unsaturated alkyd resin may be prepared by polycondensing said polyalcohol and said poly-carboxylic acid or its anhydride and further by modifying the resulting alkyd resin with a modifier. The modifier includes, for example, an aliphatic acid, e.g., lauric, oleic, stearic, linoleic or linolic acid or a mixture thereof.

The photo-sensitizer to be used for the photocurable coating composition of the present invention may be a conventional one and include, for example, a carbonyl compound, a sulfur-containing compound and a halogen compound such as benzoin, benzoin ethers, e.g. benzoin alkyl ethers (e.g. methyl, ethyl, isopropyl or isobutyl ether), acetophenone, benzophenone, benzil, 2,4-dichlorobenzaldehyde, or disulfides, such as diphenyl disulfide, dibenzyl disulfide, dibenzothiazoyl disulfide or tetramethylthiuram disulfide, 1-chloromethylnaphthalene or alpha-bromonaphthalene. The photo-sensitizer may be used alone or in combination.

The coloring agent may be used with the photocurable composition and may be particularly conventional pigment which may be chosen depending upon the kind of the photocurable composition. The coloring agents to be used with the composition are those described in the literature, for example, "Pigment Handbook", edited by Temple C. Patton, Volume 1 (published by John Wiley & Sons, Inc., New York). Examples of the coloring agents may be white (hiding or prime) pigments such as, for example, titanium dioxide, zinc pigments, e.g., zinc oxide, leaded zinc oxide, zinc sulfide or lithopone, lead pigments, e.g., basic lead carbonate, basic lead sulfate, basic lead silicate, basic lead silico sulfate dibasic lead phosphite, antimony oxide, zirconium oxide, zircon or potassium titanate; inorganic color pigments such as, for example, oxides, e.g. natural colored iron oxide, synthetic colored iron oxide pigments, for example, synthetic red iron oxide, synthetic yellow iron oxide, synthetic brown iron oxide or zinc and magnesium ferrite pigments, chromium oxides, e.g., chromium oxide green or hydrated chromium oxide green, chromates, e.g., lead chromates, for example, lead chromate pigments (chrome yellow and chrome orange) or normal lead silico chromate, molybdate orange or chrome green pigments, cadmium pigments, e.g., cadmium sulfide pigments or cadmium/mercury sulfides, ferriferrocyanide pigments (iron blue) or other inorganic color pigments, e.g., ultramarine pigments, mercuric sulfide (vermilion) or synthetic inorganic complexes; organic color pigments such as, for example, pigment green B (nitroso pigment), lake of acid yellow 1 (nitro pigment), monoazo pigments, e.g., hansa yellow and orange pigments, orthonitraniline and dinitraniline oranges, toluidine, para, and chlornitraniline reds, naphthol red and brown pigments, nickel azo yellow, helio bordeaux BL, persian orange lake, red lake C, lithol rubine pigments, for example, lithol red, rubines or rubine G pigment, miscellaneous BON pigments, e.g., permanent red or BON maroon, pigment scarlet 3B lake, scarlet 2R lake, tartrazine and anthosine lakes, e.g., tartrazine yellow lake or anthosine leakes, or benzimidazolone pigments, diazo pigments, e.g. diarylide yellow and orange pigments, pyrazolone pigments or dianisidine blue, disazo condensation pigments, basic dye pigments, for example, fugitive basic dye pigments or permanent basic dye pigments, alkali blues, peacock blue lake, phloxine, quinacridones, lake of acid yellow 3, carbazole dioxazine violet, alizarine lake, vat pigments, for example, vat pigments (red, brown, and violet) such as vat pigments (red and brown/perylene and nonperylene) or thioindigo pigments (red, violet, and brown), phthalocyanines, for example, phthalocyanine blue pigments or phthalocyanine gree pigments, carmine lake or tetrachloroisoindolinones); black pigments such as, for example, carbon black pigments, e.g., carbon black, bone black or lamp black, graphite, black iron oxides, e.g., natural iron oxides, for example, natural black iron oxide or micaceous iron oxide, or black iron oxides (synthetic), copper/chrome complex black, aniline black or logwood black; metallic pigments such as, for example, aluminum flake pigment, copper and copper alloy flake powders, zinc pigment (zinc dust) or stainless steel flake pigment; metal protective (anticorrosive) pigments other than metallic powders such as, for example, red lead, basic lead silico chromate, zinc and strontium chromates, white molybdate pigments or calcium plumbate; and nacreous (perlescent) pigments.

The photocurable coating composition to be used for the curing method of the present invention may additionally contain another polymerizable monomer, an organic solvent, a filler, an additive or the like which can be conventionally employed for this purpose. The composition may be prepared by conventional methods.

The photocurable coating composition to be used for the curing method of the present invention may be applied over a substrate or an article according to conventional methods. The coated substrate may be allowed to stand prior to the irradiation operation as necessary.

In addition to the desired effects of curing the photocurable composition as set forth hereinabove, the method of the present invention can provide the coating film or layer with tougher or harder cure than that obtained by conventional methods. Thus the photocurable coating composition to be used for the present invention can find use in a very wide variety of coating fields and allow a wider selection of the kind and the use of coloring agents in greater amounts than conventional methods can do. This multi-stage curing method can also allow the completion of curing in a considerably short period of time and it is applicable to an industrially large scale production and manufacture.

The following Examples serve as being illustrative of the present invention. In the following Reference Examples, Examples, and Comparative Examples, the terms "part" or "parts" mean part or parts by weight.

REFERENCE EXAMPLE 1

A mixture of 180 parts of xylylene diisocyanate (a mixture of ω,ω'-diisocyanato-1,3-dimethylbenzene and ω, ω'-diisocyanato-1,4-dimethylbenzene) and 0.6 part of hydroquinone was introduced into a flask equipped with a stirrer. The mixture was stirred while being cooled with water at a temperature below 70° C. A mixture of 130 parts of 2-hydroxyethyl methacrylate, 0.63 part of dibutyl tin dilaurate and 0.16 part of hydroquinone was added dropwise to the mixture over a period of about 1.5 hours. The reaction mixture was allowed to stand for about 30 minutes for aging, and this gave an isocyanate compound having a polymerizable double bond.

REFERENCE EXAMPLE 2

A mixture of 156 parts of glycidyl methacrylate, 0.12 part of dibutyl tin dilaurate and 0.24 part of hydroquinone was introduced into a flask equipped with a stirrer. 86 parts of methacrylic acid was added dropwise thereto over a period of about 2 hours at a temperature of 100° to 115° C. under a nitrogen atmosphere. The resulting mixture was reacted at the same temperature until its acid value amounted to 2 or less. The reaction mixture was cooled to ambient temperature, and 0.63 part of dibutyl in dilaurate and 0.23 part of hydroquinone were added. The resulting mixture was added dropwise to a flask equipped with a stirrer, containing 180 parts of xylylene diisocyanate and 0.23 part of hydroquinone. The mixture was then reacted in the same manner as in Reference Example 1 to give an isocyanate compound having a polymerizable double bond.

REFERENCE EXAMPLE 3

A mixture of 296 parts of phthalic anhydride, 304 parts of tetrahydrophthalic anhydride, 292 parts of adipic acid, 62 parts of ethylene glycol, 490 parts of a glycidyl tertiary alkanoate ("Cardura E" trade mark of Shell Chemical Corp.), 720 parts of "Epiclon 400" (molecular weight, 360; epoxy equivalent, 180; trade mark of Dainippon Ink & Chemicals, Inc.) and 73.4 parts of toluene was charged into a flask equipped with a stirrer. The mixture was stirred at 150° C. under a nitrogen atmosphere until its acid value amounted to 58 or less. This gave a polyester polyol. After the temperature of the reaction mixture was down to 130° C., 284 parts of glycidyl methacrylate, 12 parts of triphenyl phosphite and 1.2 parts of hydroquinone were added to the mixture until its acid value went down to 10 or less, thereby giving an unsaturated polyester prepolymer.

REFERENCE EXAMPLE 4

A mixture of 400 parts of succinic anhydride, 304 parts of tetrahydrophthalic anhydride, 292 parts of adipic acid, 174 parts of 1,10-decanediol, 980 parts of "Cardura E", 720 parts of Epiclon 400, 94.6 parts of toluene, 284 parts of glycidyl methacrylate, 16 parts of triphenyl phosphite and 1.6 parts of hydroquinone was reacted in the same manner as in Reference Example 4 to give an unsaturated polyester prepolymer having the acid value of 10.

REFERENCE EXAMPLE 5

2534.6 parts of the unsaturated prepolymer of Reference Example 3 were introduced into a flask equipped with a stirred and stirred at 110° C. under a nitrogen atmosphere. To this was added dropwise 1244 parts of the isocyanate compound of Reference Example 1 over a period of about 1 hour, and the mixture was reacted for 3 to 10 hours. After the completion of the reaction of the isocyanate groups was determined by infra-red spectro-photometry, 638 parts of butyl acetate and 1.4 parts of hydroquinone were added thereto, thereby giving a urethane-modified polymerizable composition.

REFERENCE EXAMPLE 6

A mixture of 3266.2 parts of the unsaturated polyester prepolymer of Reference Example 4, 380 parts of the isocyanate compound of Reference Example 1 and 800 parts of the isocyanate compound of Reference Example 2 was reacted in the same manner as in Reference Example 5. To the resulting mixture were added 960 parts of methyl methacrylate and 2.2 parts of hydroquinone to give a urethane-modified polymerizable composition.

REFERENCE EXAMPLE 7

A mixture of 296 parts of phthalic anhydride, 245 parts of maleic anhydride, 532 parts of tetrahydrophthalic anhydride, 186 parts of ethylene glycol, 490 parts of Cardura E, 720 parts of Epiclon 400, 284 parts of glycidyl methacrylate, 13.8 parts of triphenyl phosphite, 1.4 parts of hydroquinone and 82.6 parts of toluene was treated in the same manner as in Reference Example 3 until its acid value reached 10 or less. To this reaction mixture was added 305 parts of styrene, 305 parts of methyl methacrylate and 1.4 parts of hydroquinone, thereby giving an unsaturated polyester resinous composition.

REFERENCE EXAMPLE 8

A mixture of 35 parts of methyl methacrylate, 9 parts of styrene, 33 parts of n-butyl acrylate, 23 parts of 2-hydroxyethyl methacrylate, 1 part of lauryl mercaptan and 1 part of 2,2'-azobisisobutyronitrile was added dropwise to 70 parts of toluene which had been previously introduced into a flask equipped with a stirrer over a period of 2 hours at a reflux temperature of 110° to 115° C. under a nitrogen atmosphere. A mixture of 0.5 part of 2,2'-azobisisobutyronitrile and 30 parts of toluene was then added dropwise thereto at the same temperature over a period of 30 minutes. The resulting mixture was allowed to stand for 1.5 hours while being maintained at the same temperature, followed by the addition of 21.5 parts of tetrahydrophthalic anhydride. The resulting mixture was reacted at 110° to 115° C. until its acid value amounted to 39 or less, and a mixture of 20.1 parts of glycidyl methacrylate, 0.14 part of hydroquinone and 0.14 part of triethylamine was added dropwise thereto over a period of 30 minutes. Thereafter, the mixture was allowed to react at the same temperature until its acid value amounted to 5 or less, giving an unsaturated acrylic resinous composition (non-volatile, 58.3%; viscosity V-W measured by Gardner Bubble Viscometer).

EXAMPLE I

A photocurable coating composition having the following ingredients (in parts by weight) was prepared as follows:

| | |
|---|---|
| Polymerizable composition of Reference Example 5 | 50.0 |
| Polymerizable composition of Reference Example 6 | 75.0 |
| Trimethylol propane trimethacrylate | 25.0 |
| Benzoin methyl ether | 1.25 |
| Benzil | 2.5 |
| Butyl acetate | 40.0 |
| Titanium oxide ("Tioxide R-CR3", trade mark of British Titan Products Corp.) | 50.0 |

A mixture of these ingredients were dispersed to give a coating composition.

A clean, bright steel plate was sprayed with the coating composition by conventional air spraying method and allowed to stand for 10 minutes. The coating was then irradiated with a metal halide lamp for 1 minute as the first curing step and with a high pressure mercury lamp for 2 minutes as the second curing step. The metal halide lamp used for the first curing step was "Vio Flash 2000" (trade mark of Japan Storage Battery Co., Ltd.) having a total electrical input of 1.8 kilowatts. In this irradiation, one tube was used and irradiated in the distance of 25 centimeters from the coating surface. The high pressure mercury lamp used for the second curing step was "Type H 2000 L" (trade mark of Tokyo Shibaura Denki Co., Ltd.) having a total electrical input of 2 kilowatts. For the second curing step, two lamp tubes were employed in a distance of 20 centimeters from the coating surface to be irradiated.

As a control, another piece of the clean, bright steel plate having the coating of the composition was irradiated for 3 minutes with said high pressure mercury lamp under the same conditions as set forth above but with no second-stage irradiation.

The test specimens were observed with respect to their physical properties and these results are set out in Table I.

EXAMPLE II

| | |
|---|---|
| Polymerizable composition of Reference Example 5 | 50.0 |
| Polymerizable composition of Reference Example 6 | 75.0 |
| Trimethylol propane trimethacrylate | 25.0 |
| Benzoin octyl ether | 2.5 |
| Butyl acetate | 37.5 |
| Organic yellow pigment ("Cromophthal Yellow A2R", trade mark of Cibe-Geigy, Limited) | 12.5 |

A mixture of these ingredients was dispersed with each other giving a coating composition.

The coating composition was applied to a cleaned, bright steel plate and irradiated in the same manner as in Example I. The results are shown in Table I.

In the following Examples, the preparation of a coating composition, the application of a coating composition, conditions for irradiations, and the kind of the lamps used are the same as in Example I unless otherwise noted. And as a control, the same procedure as set forth in Example I was followed except for using a coating composition corresponding to the counterpart Examples.

EXAMPLE III

| | |
|---|---|
| Polymerizable composition of Reference Example 5 | 50.0 |
| Polymerizable composition of Reference Example 6 | 75.0 |
| Trimethylol propane trimethacrylate | 25.0 |
| Benzoin methyl ether | 2.5 |
| Butyl acetate | 25.0 |
| Organic red pigment ("Collofine Red 236", trade mark of Dainippon Ink & Chemicals, Inc.) | 25.0 |

EXAMPLE IV

| | |
|---|---|
| Polymerizable composition of Reference Example 5 | 50.0 |
| Polymerizable composition of Reference Example 6 | 75.0 |
| Trimethylol propane trimethacrylate | 15.0 |
| Cyclohexyl methacrylate | 2.5 |
| Benzoin methyl ether | 2.5 |
| Butyl acetate | 37.5 |
| Iron oxide red pigment ("Tenyo Bengare #501", trade mark of Tone Sangyo Kabushiki Kaisha) | 12.5 |

EXAMPLE V

| | |
|---|---|
| Polymerizable composition of Reference Example 5 | 50.0 |
| Polymerizable composition of Reference Example 6 | 75.0 |
| Trimethylol propane trimethacrylate | 25.0 |

| | |
|---|---|
| Benzil | 2.5 |
| Butyl acetate | 37.5 |
| Prussian blue ("N-650 Konjyo", trade mark of Dainichi Seika Kabushiki Kaisha) | 12.5 |

EXAMPLE VI

| | |
|---|---|
| Polymerizable composition of Reference Example 5 | 50.0 |
| Polymerizable composition of Reference Example 6 | 75.0 |
| Triallyl isocyanurate | 25.0 |
| Benzoin propyl ether | 2.5 |
| Butyl acetate | 37.5 |
| Organic green pigment ("Cyanine Green 2YK", trade mark of Dainippon Ink & Chemicals, Inc.) | 12.5 |

EXAMPLE VII

| | |
|---|---|
| Polymerizable composition of Reference Example 5 | 50.0 |
| Polymerizable composition of Reference Example 6 | 75.0 |
| Trimethylol propane trimethacrylate | 25.0 |
| Benzoin methyl ether | 2.5 |
| Butyl acetate | 45.0 |
| Black pigment ("Black Pearl 607", trade mark of Cabot Corp.) | 5.0 |

EXAMPLE VIII

| | |
|---|---|
| Unsaturated polyester resinous composition of Reference Example 7 | 125.0 |
| Trimethylol propane trimethacrylate | 20.0 |
| Styrene | 5.0 |
| Benzil | 2.5 |
| Butyl acetate | 60.0 |
| Tioxide R-CR3 | 30.0 |

EXAMPLE IX

| | |
|---|---|
| Polymerizable composition of Reference Example 5 | 125.0 |
| Benzoin methyl ether | 2.5 |
| Butyl acetate | 65.0 |
| Cromophthal Yellow A2R | 12.5 |

EXAMPLE X

| | |
|---|---|
| Unsaturated acrylic resinous composition of Reference Example 8 | 172.0 |
| Trimethylol propane trimethacrylate | 25.0 |
| Benzoin methyl ether | 2.5 |
| Butyl acetate | 20.0 |
| Cromophthal Yellow A2R | 12.5 |

EXAMPLE XI

| | |
|---|---|
| Coating composition of Example I | 100.0 |
| Coating composition of Example III | 0.3 |
| Coating composition of Example V | 0.7 |
| Coating composition of Example VII | 4.6 |

A mixture of these ingredients was mixed thoroughly with a high speed mixer to give a coating composition.

EXAMPLE XII

| | |
|---|---|
| Coating composition of Example I | 4.9 |
| Coating composition of Example III | 1.5 |
| Coating composition of Example V | 73.1 |
| Coating compositon of Example VII | 20.5 |

A mixture of these ingredients was mixed in the same manner as in Example XI.

EXAMPLE XIII

| | |
|---|---|
| Polymerizable composition of Reference Example 5 | 50.0 |
| Polymerizable composition of Reference Example 6 | 75.0 |
| Trimethylol propane trimethacrylate | 25.0 |
| Benzoin methyl ether | 1.25 |
| Benzil | 2.5 |
| Butyl acetate | 58.0 |
| Tioxide R-CR3 | 100.0 |

EXAMPLE XIV

| | |
|---|---|
| Polymerizable composition of Reference Example 5 | 34.6 |
| Polymerizable composition of Reference Example 6 | 52.1 |
| Trimethylol propane triacrylate | 17.3 |
| BEnzoin methyl ether | 0.91 |
| Benzil | 1.62 |
| Butyl acetate | 40.0 |
| Tioxide R-CR3 | 64.2 |
| N-650 Konjyo | 0.16 |
| Black Pearl 607 | 0.22 |
| Collofine Red 236 | 0.06 |

EXAMPLE XV

| | |
|---|---|
| Polymerizable composition of Reference Example 5 | 50.0 |
| Polymerizable composition of Reference Example 6 | 75.0 |
| Trimethylol propane triacrylate | 25.0 |
| Benzoin isobutyl ether | 2.5 |
| Butyl acetate | 43.0 |
| Cromophthal Yellow A2R | 25.0 |

TABLE I

| Examples | Film Thickness (microns) | Performance Appearance[a] | Surface[b] Gloss | Pencil[c] Hardness | Maximum Film[d] thickness |
|---|---|---|---|---|---|
| I | 140 | Good | Good | H | 140 |
| Control-I | 80 | Fair | Fair | H | less than 80 |

TABLE I-continued

| Examples | Film Thickness (microns) | Appearance[a] | Surface[b] Gloss | Pencil[c] Hardness | Maximum Film[d] thickness |
|---|---|---|---|---|---|
| II[e] | 15 | Poor | — | — | less than 15 |
| II | 15 | " | — | — | less than 15 |
| II[f] | 85 | Good | Good | H | 85 |
| II[g] | 85 | " | " | H | 85 |
| Control-II | 17 | Fair | Poor | H | less than 17 |
| III | 80 | Good | Good | H | 80 |
| Control-III | 55 | Fair | Fair | H | less than 55 |
| IV | 90 | Good | Good | F | 90 |
| Control-IV | 60 | Fair | Fair | F | less than 60 |
| V[f] | 110 | Good | Good | F | 110 |
| Control-V | 80 | Fair | Fair | F | less than 80 |
| VI[f] | 100 | Good | Good | F | 100 |
| Control-VI | 48 | Fair | Fair | F | less than 48 |
| VII[f] | 55 | Good | Good | F | 55 |
| Control-VII | 50 | Fair | Fair | F | less than 50 |
| VII | 110 | Good | Good | HB | 110 |
| Control-VIII | 60 | Fair | Fair | HB | less than 60 |
| IX | 100 | Good | Good | 2H | 100 |
| Control-IX | 40 | Fair | Fair | 2H | less than 40 |
| X | 60 | Good | Good | F | 60 |
| Control-X | 40 | Fair | Poor | F | less than 40 |
| XI[h] | 110 | Good | Gpod | H | 110 |
| XI | 110 | " | " | H | 110 |
| XI[j] | 80 | " | Fair | H | less than 80 |
| XI[i] | 80 | " | " | F | less than 80 |
| XI[j] | 80 | " | " | B | less than 80 |
| Control-XI | 30 | Poor | Poor | — | less than 30 |
| XII[k] | 40 | Good | Good | H | 40 |
| XII[l] | 80 | " | " | H | 80 |
| XII[h] | 100 | " | " | H | 100 |
| XII | 100 | " | " | H | 100 |
| XII[i] | 90 | " | " | F | 90 |
| XII[j] | 80 | " | " | B | 80 |
| Control-XII | 30 | Fair | Fair | H | less than 30 |

Note:
[a] Appearance by naked eyes' observation is broken down in three groups: Good - No undesirable surface defects observed. Fair - Very fine crinkles observed. Poor - Crinkles and wrinkles observed.
[b] Surface gloss was divided into three groups: Good - Good gloss. Fair - Slight reduction in gloss. Poor - No gloss and the surface dulled.
[c] Pencil hardness was determined with pencils ("Mitsubishi UNI", trade name of Mitsubishi Enpitsu Kabushiki Kaisha).
[d] Maximum film thickness (expressed in microns) means a maximum thickness by which no undesirable surface defects were observed on the coating surface when measured with Kett-type electromagnetic film thickness gauge.
[e]- l) In these examples, the two-stage curing steps were conducted for the following irradiation periods of time:
[e] first irradiation time: 0.5 minute second irradiation time: 2 minutes
[f] first irradiation time: 2 minutes second irradiation time: 2 minutes
[g] first irradiation time: 3 minutes second irradiation time: 2 minutes
[h] first irradiation time: 0.5 minute second irradiation time: 2.5 minutes
[i] first irradiation time: 2 minutes second irradiation time: 1 minute
[j] first irradiation time: 5 minutes second irradiation time: 0.5 minute
[k] first irradiation time: 1/12 minute second irradiation time: 3 minutes
[l] first irradiation time: 1/3 minute second irradiation time: 2 minutes

COMPARATIVE EXAMPLE 1

With the coating composition of Example I, the coatings (thickness, 20, 55, 75, and 90 microns) were irradiated separately with radiation of wavelength of 4,000 Angstrom units from a commercially available, conventional medium pressure mercury lamp (lamp intensity, 1,600 watts/15 cm.×2.54=270.93 watts/inch) for a period of time of 6 seconds in a distance of 10 inches in the presence of air and thereafter with radiation of wavelength of 2537 Angstrom units from a 40 watt low pressure mercury lamp (lamp intensity=2.42 watts per inch; "SUV-40", trade name of Sen Special Light Sources Co., Ltd.) in a distance of 1 inch for a period of time of 6 seconds in the presence of nitrogen gas at the flow velocity of 800 c.c. per minute.

It was found that the photo-cure was incomplete for all the coating thicknesses because of the short period of irradiation.

COMPARATIVE EXAMPLE 2

With the coating composition of Example I, the coatings having thicknesses of 20, 55, 75, and 90 microns were treated in the same manner as in Comparative Example 1 except for the prolonged irradiation periods of time, that is, for 1 minute in the first irradiation step and for 2 minutes in the second irradiation step. The results are set out in Table II.

COMPARATIVE EXAMPLE 3

With the coating composition of Example I, the coating was treated by the same procedures employed in Comparative Example 2 except that the second irradiation was carried out in the presence of air instead of the nitrogen gas. The results are set out in Table II.

COMPARATIVE EXAMPLE 4

With the coating composition of Example 1 and the procedures employed in Comparative Example 2, irradiation was carried out in which the second irradiation referred to therein was conducted initially and the first irradiation referred to therein was conducted thereafter. The results are shown in Table II.

TABLE II

| Example | Film Thickness (microns) | Performance Appearance[a] | Surface[b] Gloss | Hiding[m] power |
|---|---|---|---|---|
| I | 25 | Good | Good | Poor |
| I | 75 | Good | Good | Good |
| I | 85 | Good | Good | Good |
| I | 100 | Good | Good | Good |
| Comparative Example 2 | 20 | Good | Good | Poor |
| " | 55 | Fair | Good | Good |
| " | 75 | Poor | Poor | — |
| " | 90 | Poor | Poor | — |
| Comparative Example 3 | 25 | Poor | — | — |
| " | 65 | Poor | — | — |
| " | 85 | Poor | — | — |
| " | 100 | Poor | — | — |
| Comparative Example 4 | 20 | Good | Good | Poor |
| " | 65 | Fair | Good | Good |
| " | 85 | Poor | — | — |
| " | 100 | Poor | — | — |

Note:
[m]Hiding power was observed by naked eyes as to whether the substrate surface was visible through the coating. In the table, the sign (—) means the valuelessness of the hiding or covering power and surface gloss because of their undesirable surface conditions.

EXAMPLE XVI

The components of Example XIII were dispersed with each other, resulting in a coating composition having a white color. The coating composition was applied to a cleaned, bright steel plate by means of wire wound rod #12, #20, or #30 giving the film thicknesses as set forth in Table III. The coated plate was left to stand for 10 minutes and thereafter treated in the same manner as in Example I. The results are shown in Table III.

COMPARATIVE EXAMPLE 5

A cleaned bright steel plate was coated with the coating composition employed in Example XVI in the same manner as in Example XVI resulting in film thicknesses as described in Table III. After being left to stand for 10 minutes, the coating was treated by the same procedure as in Comparative Example 4 except that the first stage irradiation was conducted for 1 minute in air and the second stage irradiation for 2 minutes in air. The results are set out in Table III.

COMPARATIVE EXAMPLE 6

A cleaned bright steel plate was coated as in Comparative Example 5 and irradiated by the same procedure as in Comparative Example 3 except that the first stage irradiation was carried out for 2 minutes and the second stage for 1 minute. The results are shown in Table III.

COMPARATIVE EXAMPLE 7

A cleaned bright steel plate was coated by the same method as in Example XVI and treated by irradiation in the same manner as in Comparative Example 4 except that the first irradiation was conducted in the presence of a nitrogen gas for 1 minute and the second in the presence of air for 2 minutes. The results are shown in Table III.

EXAMPLE XVII

A cleaned bright steel plate was coated with a coating composition (having an off-white color) made of the components of Example XIV in the same manner as in Example XVI. After being left to stand for 10 minutes, the coating was irradiated in the same manner as in Example XVI. The results are set out in Table III.

COMPARATIVE EXAMPLE 8

With the coating composition employed in Example XVII, a cleaned bright steel plate was treated in the same manner as in Example XVII and the method employed in Comparative Example 5. The results are shown in Table III.

COMPARATIVE EXAMPLE 9

With the coating composition employed in Example XVII, a cleaned bright steel plate was treated in the same manner as in Example XVII and irradiated by the method used in Comparative Example 6. The results are shown in Table III.

COMPARATIVE EXAMPLE 10

With the coating composition used in Example XVII, the coating was conducted in the same manner as in Example XVII and irradiated by the procedures used in Comparative Example 7. The results are shown in Table III.

EXAMPLE XVIII

The components of Example XV was treated in the same manner as in Example XVI giving a coating composition with a yellowish brown color.

A cleaned bright steel plate was coated with the composition as in Example XVI and left to stand for 10 minutes. The coating was irradiated by the procedures used in Example XVI. The results are set out in Table III.

COMPARATIVE EXAMPLE 11

With the coating composition used in Example XVIII, a cleaned bright steel plate was treated in the same manner as in Example XVIII and the coating was irradiated by the method used in Comparative Example 5. The results are shown in Table III.

COMPARATIVE EXAMPLE 12

With the composition and the procedures employed in Comparative Example 11, the coating was irradiated as in Comparative Example 6. The results are shown in Table III.

COMPARATIVE EXAMPLE 13

With the composition and the procedures employed in Comparative Example 11, the coating was irradiated as in Comparative Example 7. The results are shown in Table III.

TABLE III

| Example | Film Thickness (microns) | Performance Appearance[a] | Surface[n] Gloss | Hiding[m] power |
|---|---|---|---|---|
| XVI | 12 | Good | 92.6 | Good |
| " | 20 | " | 93.1 | " |
| " | 31 | " | 92.8 | " |
| Comparative Example 5 | 13 | Poor | 2.5 | " |
| " | 22 | " | 2.4 | " |

TABLE III-continued

| Example | Film Thickness (microns) | Performance Appearance[a] | Surface[n] Gloss | Hiding[m] power |
|---|---|---|---|---|
| " | 32 | " | 2.7 | " |
| Comparative Example 6 | 10 | " | 3.6 | " |
| " | 25 | " | 2.7 | " |
| " | 31 | " | 3.7 | " |
| Comparative Example 7 | 14 | " | 6.2 | " |
| " | 25 | " | 4.9 | " |
| " | 30 | " | 2.5 | " |
| XVII | 12 | Good | 92.2 | Good |
| " | 16 | " | 92.6 | " |
| " | 33 | " | 94.1 | " |
| Comparative Example 8 | 13 | Poor | 3.0 | " |
| " | 24 | " | 2.7 | " |
| " | 33 | " | 2.7 | " |
| Comparative Example 9 | 12 | " | 3.1 | " |
| " | 22 | " | 3.1 | " |
| " | 37 | " | 3.0 | " |
| Comparative Example 10 | 10 | " | 11.1 | " |
| " | 15 | " | 20.7 | " |
| " | 25 | " | 22.5 | " |
| XVIII | 10 | Good | 89.2 | Good |
| " | 18 | " | 90.4 | " |
| " | 30 | " | 89.7 | " |
| Comparative Example 11 | 9 | Poor | 1.8 | " |
| " | 14 | " | 2.0 | " |
| " | 30 | " | 2.5 | " |
| Comparative Example 12 | 8 | " | 3.0 | " |
| " | 14 | " | 2.5 | " |
| " | 30 | " | 3.1 | " |
| Comparative Example 13 | 13 | " | 6.5 | " |
| " | 16 | " | 4.4 | " |
| " | 36 | " | 3.5 | " |

Note:
[n] The surface gloss was determined by the JIS K-5400-6.7 (1970) designation.

What we claim is:

1. In a method of curing a photocurable coating composition by irradiating the composition with actinic radiation therein, said composition containing as the principal component an unsaturated polyester resin, an unsaturated polyurethane resin, an unsaturated acrylic resin, and an unsaturated epoxy resin and a photosensitizer, the improvement wherein the coating composition is irradiated in air in two stages; (1) the first stage, wherein the photocurable coating composition is subjected to actinic radiation with a metal halide lamp emitting wavelengths in the range of about 185 to 500 millimicrons, having a dominant wavelength or wavelengths in the range of 380 to 420 millimicrons and (2) a second stage wherein the photocurable composition is further subjected to another actinic radiation with a medium or high pressure mercury lamp emitting wavelengths in the range of 185 to 500 millimicrons having a dominant wavelength or wavelengths shorter than that in the first stage and falling in the range of from about 360 to 380 millimicrons.

2. A method according to claim 1, wherein the metal halide lamp used in the first stage is one containing a metal and/or a metallic compound in addition to argon and mercury, the metal and the metal of the metallic compound being a member or a combination of members selected from the group consisting of gallium, lead, aluminum, calcium, cerium, indium, potassium, lanthanum, magnesium, manganese, molybdenum, niobium, scandium, strontium and thorium.

3. A method according to claim 2, wherein the metallic compound is a metal iodide or a metal bromide.

4. A method according to claim 3, wherein the metal iodide is gallium iodide.

5. A method according to claim 1, wherein the photocurable coating composition is irradiated in the first stage for from 0.5 second to 20 minutes.

6. A method according to claim 1, wherein the photocurable coating composition is irradiated in the second stage for from about 0.5 second to 15 minutes.

7. In a method according to claim 1, wherein the photocurable coating composition is irradiated in the first stage for from 0.5 second to 20 minutes and in the second stage for from about 0.5 second to 15 minutes.

8. In a method according to claim 1, wherein the photocurable coating composition contains an organic solvent.

9. In a method according to claim 1, wherein the photocurable coating composition contains a coloring agent.

10. In a method according to claim 1, wherein the photocurable coating composition contains a polymerizable monomer.

11. A method according to claim 1, wherein the unsaturated polyester resin is a resin produced by polycondensing a pholyalcohol and a polycarboxylic acid to produce a resin and further reacting the resin with a fatty aliphatic acid, or a mixture of the fatty aliphatic acids.

* * * * *